United States Patent
Zhang et al.

(10) Patent No.: US 6,204,734 B1
(45) Date of Patent: Mar. 20, 2001

(54) METHOD AND APPARATUS FOR EXTENDING A VCO TUNING RANGE

(75) Inventors: Andrew Zhang, Cerritos; Roy H. Fladager, Irvine, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/498,378

(22) Filed: Feb. 3, 2000

(51) Int. Cl.⁷ .................................................. H03B 5/12
(52) U.S. Cl. ............................. 331/117 R; 331/36 C; 331/175; 331/177 V
(58) Field of Search ............................. 331/36 C, 116 R, 331/116 FE, 117 R, 117 FE, 117 D, 175, 177 V

(56) References Cited

U.S. PATENT DOCUMENTS

| | | | |
|---|---|---|---|
| 3,571,754 | * 3/1971 | Healey, III et al. | 331/116 |
| 3,984,782 | * 10/1976 | Rosen et al. | 331/107 R |
| 4,134,085 | * 1/1979 | Driscoll et al. | 331/116 R |
| 5,714,915 | 2/1998 | Brilka | 33/117 R |

* cited by examiner

*Primary Examiner*—David Mis
(74) *Attorney, Agent, or Firm*—Welsh & Katz, Ltd.

(57) ABSTRACT

Method and apparatus for extending a VCO tuning range. A shunt inductance connected in parallel with a varactor reduces the effective capacitance of the varactor and increases the capacitance ratio. This increases the VCO tuning range without increasing the tuning sensitivity variation and the phase noise.

18 Claims, 1 Drawing Sheet

METHOD AND APPARATUS FOR EXTENDING A VCO TUNING RANGE

BACKGROUND AND SUMMARY

The present invention relates to extending the tuning range of a voltage controlled oscillator (VCO).

In developing products which are compatible with industry standards, such as GSM/DCS (Global System for Mobile Communications/Digital Communication Systems), it is necessary to tailor the design within the constraints imposed by those standards. For example, an oscillator may be required to have a wide tuning range, while limiting phase noise and tuning sensitivity variation. At times, it can be challenging to achieve all of the requirements given commercially available components and their inherent tolerances. It is particularly difficult to do so with a conventional tank circuit—an inductor and a capacitor in parallel.

Phase noise of the VCO is determined largely by the Q (quality factor) of the tank circuit. A VCO with less phase noise can be achieved if there is a larger Q. This will result in lower total RMS phase error in the system and an output signal with a cleaner spectrum. RMS phase error and spectrum purity are two of the most important specifications for any communications system.

A varactor may be used in designing a tank circuit. The voltage dependent capacitance of the varactor can be varied to tune the VCO frequency. The tank circuit Q is dependent on the Q factors of its components, and the Q of a varactor is typically much lower than that of other capacitances or inductances. When a varactor is present in a tank circuit to tune the VCO frequency, the Q of the varactor is usually the limiting factor of a tank circuit Q.

The degradation of the tank circuit Q caused by a varactor can be reduced by using a coupling capacitance to reduce the impact of the varactor capacitance on performance of the tank circuit. However, this also reduces the tuning range of the VCO. Around a given operating frequency, the tuning range can depend on the capacitance ratio of the tank circuit, which results from the impact on the tank circuit of the variable capacitance of the varactor. Therefore, modifying the impact of the varactor capacitance on the tank circuit by adjusting the coupling capacitance is a trade-off. Extending tuning range degrades Q and phase noise, and vice versa.

In addition, capacitance of a varactor generally varies nonlinearly with respect to the control voltage. Consequently, increasing the impact of the varactor capacitance on the tank circuit also degrades the tuning sensitivity variation of the VCO.

Besides adjusting a coupling capacitance, the tuning range also can be extended by using a varactor with a greater range of capacitance. However, any design is limited by what is commercially available to implement the design. Varactors with a greater range of capacitance generally have a lower Q and more non-linearity. The tuning range can be extended using a varactor with a greater range of capacitance, but the tuning sensitivity and phase noise of the VCO will suffer.

An improved and novel way to extend the tuning range of a VCO while also satisfying the other constraints is to connect a shunt inductance in parallel with the varactor. Prior art did not recognize this way to extend tuning range of a VCO tank circuit without affecting tuning sensitivity variation and phase noise.

The features of the present invention which are believed to be novel are set forth below with particularity in the appended claims. The invention, together with further advantages thereof, may be understood by reference to the following description in conjunction with the accompanying figures. FIG. 3 illustrates an embodiment of the invention.

DETAILED DESCRIPTION

Figure 1:
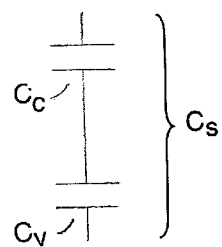
FIG. 1 shows an example of a variable capacitance in series with a coupling capacitance.

FIG. 1 is an illustration, for discussion purposes, of a variable capacitance $C_v$ in series with a coupling capacitance $C_c$. The two in series may be viewed together as an effective capacitance $C_s$ with an impedance $$\frac{1}{j\omega C_s} = \frac{1}{j\omega C_v} + \frac{1}{j\omega C_c}. \quad (1)$$

$$C_v C_c = C_s C_c + C_s C_v, \text{ and}$$

$$C_s = C_v \left( \frac{C_c}{C_c + C_v} \right).$$

As the coupling capacitance $C_c$ is made larger relative to the variable capacitance $C_v$, the variable capacitance $C_v$ has a greater impact on the effective capacitance $C_s$ of the two capacitances in series.

A varactor is not only a variable capacitance but also has resistance associated with its impedance, and is generally a relatively low Q component. The Q factor is inversely related to capacitance and resistance. Since $C_s$ is always less than $C_v$, the coupling capacitance $C_c$ always results in the combined components in series having a higher Q than a varactor alone. However, the impact of the varactor and its low Q on the combined components in series increases as $C_c$ is made larger relative to $C_v$.

Similarly, as $C_c$ is made larger relative to $C_v$, the ratio of a change in $C_v$ (or $_\Delta C_v$) to $C_v$ has a greater impact on the ratio of a change in $C_s$ (or $_\Delta C_s$) to $C_s$. As $C_v$ changes to $C_v - _\Delta C_v$, the change in $C_s$ may be represented as $$\Delta C_s = \frac{C_c C_v}{C_c + C_v} - \frac{C_c(C_v - \Delta C_v)}{C_c + C_v - \Delta C_v}$$

$$= \frac{C_c C_v (C_c + C_v - \Delta C_v) - C_c(C_v - \Delta C_v)(C_c + C_v)}{(C_c + C_v)(C_c + C_v - \Delta C_v)}$$

$$= \frac{C_c C_v (C_c + C_v - \Delta C_v) - C_c(C_v - \Delta C_v)(C_c + C_v)}{(C_c + C_v)(C_c + C_v - \Delta C_v)}$$

$$= \frac{C_c^2 \Delta C_v}{(C_c + C_v)(C_c + C_v - \Delta C_v)}.$$

The ratio of $_\Delta C_s$ to $C_s$ may be represented as $$\frac{\Delta C_s}{C_s} = \frac{C_c^2 \Delta C_v (C_c + C_v)}{(C_c + C_v)(C_c + C_v - \Delta C_v) C_c C_v} = \frac{C_c \Delta C_v}{C_v (C_c + C_v - \Delta C_v)} \quad (2)$$

$$= \left( \frac{\Delta C_v}{C_v} \right) \left( \frac{C_c}{C_c + C_v - \Delta C_v} \right).$$

The ratio of $_\Delta C_s$ to $C_s$ is always less than the ratio of $_\Delta C_v$ to $C_v$. However, as $C_c$ is made larger relative to $C_v$, not only does $C_v$ have a greater impact on $C_s$, but the ratio of $_\Delta C_v$ to $C_v$ has a greater impact on the ratio of $_\Delta C_s$ to $C_s$.

Adding a coupling capacitance in series with a varactor lowers the effective capacitance of the combination, raises the Q, and reduces the capacitance ratio relative to the varactor alone. As the coupling capacitance is made larger relative to the capacitance of the varactor, the impact of the low Q and the capacitance ratio of the varactor increases. If this series combination of FIG. 1 is part of a tank circuit of a VCO, a larger coupling capacitor can extend tuning range, but it will simultaneously increase phase noise and tuning sensitivity variation.

Figure 2:
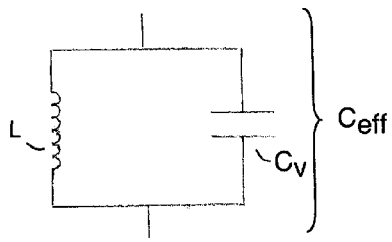
FIG. 2 shows an example of a variable capacitance in parallel with a shunt inductance.

FIG. 2 is an illustration, for discussion purposes, of a variable capacitance $C_v$ in parallel with a shunt inductance L. The parallel combination may be viewed together as an effective capacitance $C_{eff}$, with an impedance $$Z = \frac{1}{j\omega C_{eff}} = \frac{1}{j\omega C_v + \frac{1}{j\omega L}} = \frac{j\omega L}{1 - \omega^2 L C_v}.$$

$$1 - \omega^2 L C_v = -\omega^2 L C_{eff}.$$

$$C_{eff} = \frac{1 - \omega^2 L C_v}{-\omega^2 L} = C_v - \left(\frac{1}{\omega^2 L}\right).$$

Therefore, $C_{eff}$ is less than $C_v$. However, the absolute value of the change of $C_{eff}$ is the same as the absolute value of the change of $C_v$. If $C_v$ changes from $C_1$ to $C_2$, the change in $C_{eff}$ may be represented as $$\Delta C_{eff} = \left(C_1 - \frac{1}{\omega^2 L}\right) - \left(C_2 - \frac{1}{\omega^2 L}\right) = C_1 - C_2.$$

Compared to a variable capacitance $C_v$ without a shunt inductance L, the two in parallel have a smaller effective capacitance $C_{eff}$ without altering the absolute value of the change in capacitance, $C_1-C_2$, or $_\Delta C_v$.

When a varactor with a shunt inductance is substituted for a varactor alone in a series combination with a coupling capacitor, the smaller $C_{eff}$ of the two in parallel can be substituted for the $C_v$ (of the varactor alone) in equations (1) and (2) discussed above. However, the $_\Delta C_v$ remains the same. Therefore, the capacitance ratio can be higher, without increasing the impact of the low Q and nonlinearity of the varactor.

The operating frequency of a tank circuit is a function of a circuit capacitance, such as $C_s$ of FIG. 1, and a separate circuit inductance not illustrated in FIGS. 1 or 2. If CS is reduced by inclusion of the shunt inductance L in parallel with the variable capacitance $C_v$, the desired operating frequency can be maintained by increasing the separate circuit inductance.

Compared to the impact of a varactor alone on a tank circuit, the impact of an effective capacitance $C_{eff}$, of a shunt inductance in parallel with the varactor, is to extend the tuning range about a given operating frequency without degrading phase noise or tuning sensitivity variation.

Figure 3:
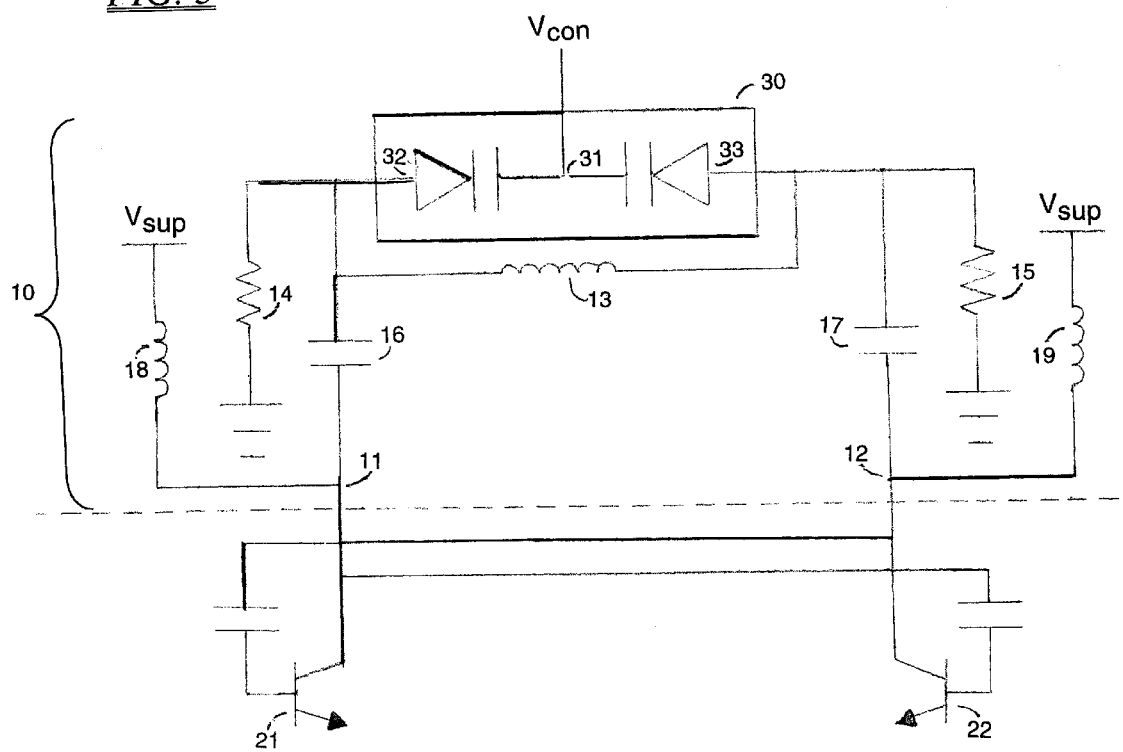
FIG. 3 shows the circuit diagram of one embodiment of part of a VCO according to the invention.

FIG. 3 shows an example of circuitry for part of a VCO which is a differential multivibrator. A tank circuit 10 is shown above the dashed line. Terminals 11 and 12 of the tank circuit 10 are connected to two transistors 21 and 22 which are part of an integrated circuit below the dashed line.

The example tank circuit 10, shown in FIG. 3, has a common cathode dual diode varactor 30 with a control voltage Vcon connected to the cathode junction 31. A shunt inductance 13 is connected across the anodes 32 and 33 of the varactor 30. The anodes 32 and 33 are each connected to ground via a resistor 14 and 15, respectively. They are each connected to one of the tank circuit terminals 11 and 12 via a capacitor 16 and 17, respectively, as shown. A supply voltage Vsup is connected to terminals 11 and 12 via inductors 18 and 19, respectively.

An embodiment of the tank circuit 10 shown in FIG. 3 was built using an Alpha 1234 hyper-abrupt junction varactor 30. The capacitance of each of the diodes ranged from about 10 pF to about 4 pF over a control voltage Vcon of about 0 to about 3 volts. For this illustrative example, a shunt inductance 13 of about 18 nH was chosen, capacitors 16 and 17 were each chosen to be about 18 pF, and inductances 18 and 19 were each chosen to be about 5.6 nH. The capacitance and inductance values were chosen to enhance design robustness. By including shunt inductance 13, the tuning range was increased 50% without changing the phase noise or the tuning sensitivity variation.

The embodiments discussed and/or illustrated are examples. They are not exclusive ways to practice the present invention, and it should be understood that there is no intent to limit the invention by such disclosure. Rather, it is intended to cover all modifications and alternative constructions and embodiments that fall within the scope of the invention as defined in the following claims.

What is claimed is:

1. A method of extending a tuning range of a voltage controlled oscillator about a given operating frequency without substantially increasing tuning sensitivity variation and phase noise, the oscillator having a tank circuit which includes a varactor circuit having a change of capacitance over a range of a control voltage, the method comprises reducing effective capacitance of the varactor circuit in the tank circuit while substantially maintaining the change of capacitance over the range of the control voltage.

2. The method as in claim 1, wherein the step of reducing comprises coupling a shunt inductance in parallel with the varactor circuit.

3. The method as in claim 2, further comprising capacitively coupling the varactor circuit into the tank circuit.

4. The method as in claim 1, wherein the varactor circuit comprises dual diode circuitry.

5. The method as in claim 4, the method comprising coupling a shunt inductance across the two diodes at first and second junctions, coupling the control voltage to a common junction of the dual diode varactor, and coupling first and second coupling capacitors to the first and second junctions, respectively.

6. The method as in claim 5, the method further comprising coupling the first junction to ground via a first resistor and to a first terminal of the tank circuit via the first capacitor, coupling the second junction to ground via a second resistor and to a second terminal of the tank circuit via the second capacitor, and coupling a supply voltage to the first terminal via a first inductor and to the second terminal via a second inductor.

7. Extending tuning range circuitry for a voltage controlled oscillator, the circuitry comprising a tank circuit including
   a) a varactor; and
   b) a shunt inductance coupled in parallel with the varactor such that a parallel combination of the varactor and the shunt inductance has a smaller effective capacitance and a larger capacitance ratio than the varactor alone, and such that tuning sensitivity variation and phase noise of the voltage controlled oscillator about a given operating frequency remain substantially the same as with the varactor alone.

8. The circuitry as in claim 7, the tank circuit further including at least one coupling capacitor in series with the parallel combination.

9. The circuitry as in claim 7, wherein the oscillator is a differential multivibrator.

10. The circuitry as in claim 7, wherein the varactor comprises dual diodes.

11. The circuitry as in claim 10, wherein the varactor comprises a common cathode dual diode configuration.

12. The circuitry as in claim 10, the tank circuit further including first and second coupling capacitors, wherein a control voltage is coupled to a common junction of the dual diode varactor, the shunt inductance is coupled across first and second junctions of the two diodes, and the first and second junctions are coupled to the first and second coupling capacitors, respectively.

13. The circuitry as in claim 12, the tank circuit further including first and second resistors, and first and second inductors, and wherein the first junction is coupled to ground via the first resistor and is coupled to a first terminal of the tank circuit via the first capacitor, the second junction is coupled to ground via the second resistor and is coupled to a second terminal of the tank circuit via the second capacitor, a supply voltage is coupled to the first terminal via the first inductor and to the second terminal via the second inductor.

14. A tank circuit of a voltage controlled oscillator, the circuit comprising a varactor and means for extending a tuning range of the voltage controlled oscillator about a given operating frequency without substantially increasing tuning sensitivity variation and without substantially increasing phase noise.

15. The circuit as in claim 14, wherein the varactor comprises dual diodes.

16. Extending tuning range circuitry for a voltage controlled oscillator, the circuitry comprising:
   a) a tank circuit;
   b) means for providing voltage dependent capacitance in the tank circuit; and
   c) means for providing parallel inductance across the voltage dependent capacitance providing means to form a parallel combination in the tank circuit having reduced effective capacitance and greater capacitance ratio than the voltage dependent capacitance providing means alone, and to extend a tuning range of the voltage controlled oscillator about a given operating frequency while substantially maintaining tuning sensitivity variation and phase noise.

17. The circuit as in claim 16, further comprising means for capacitively coupling the parallel combination to the tank circuit.

18. The circuit as in claim 16, wherein the voltage dependent capacitance providing means comprises dual diodes.

* * * * *